(12) United States Patent
Chakraborty

(10) Patent No.: US 9,529,942 B1
(45) Date of Patent: Dec. 27, 2016

(54) AUTO-OPTIMIZING OUT-OF-CORE METHOD AND SYSTEM FOR RENDERING OF LARGE ENGINEERING 3D CAD ASSEMBLIES ON HANDHELD DEVICES

(71) Applicant: Geometric LTD., Mumbai (IN)

(72) Inventor: Tathagata Chakraborty, Pune (IN)

(73) Assignee: GEOMETRIC LTD., Mumbai (IN)

(*) Notice: Subject to any disclaimer, the term of this patent is extended or adjusted under 35 U.S.C. 154(b) by 801 days.

(21) Appl. No.: 13/970,363

(22) Filed: Aug. 19, 2013

(51) Int. Cl.
*G06F 17/50* (2006.01)

(52) U.S. Cl.
CPC .................. *G06F 17/50* (2013.01)

(58) Field of Classification Search
CPC ........................................ G06F 17/50
USPC .............................. 703/1; 707/752
See application file for complete search history.

(56) References Cited

U.S. PATENT DOCUMENTS

| 6,933,946 B1* | 8/2005 | Silva .................. G06T 1/60 345/582 |
| 2010/0289804 A1* | 11/2010 | Jackman .................. G06F 9/547 345/520 |

OTHER PUBLICATIONS

Guthe et al., "Real-time out-of-core rendering", 2005, International Journal of Image and Graphics, pp. 1-18.*
Gao et al., "Efficient view-dependent out-of-core rendering of large-scale and complex scenes", 2006, Proceedings of the ACM international conference on Virtual reality continuum and its applications, pp. 297-303.*
Gao et al., "Efficient out-of-core rendering of complex 3d scenes", 2006, International Conference on Technologies for E-Learning and Digital Entertainment, Springer Berlin Heidelberg, pp. 883-892.*
Chen et al., "View-Dependent Out-of-Core Rendering of Large-Scale Virtual Environments with Continuous Hierarchical Levels of Detail", 2008, International Conference on Computer Science and Information Technology ICCSIT, IEEE, pp. 313-321.*
Low et al., "Model Simplification using Bertex Clustering," Proceedings of the 1997 symposium on Interactive 3D graphics, 1997, pp. 75-81.
Hudson et al., "Accelerated occlusion culling using shadow frusta," SCG 1997 Proceedings of the thirteenth annual symposium on 97 Computational Geometry.
Vitter, J. S., "External memory algorithms and data structures: dealing with massive data," ACM Computing Surveys (CSUR), Jun. 2001, vol. 33:2, pp. 209-271.

(Continued)

*Primary Examiner* — Kamini S Shah
*Assistant Examiner* — Juan Ochoa
(74) *Attorney, Agent, or Firm* — Stites & Harbison, PLLC; Jeffrey A. Haeberlin

(57) ABSTRACT

A method for rendering data of a 3D CAD assembly includes a parsing step for creating an array storing the size and location of the data, a sorting step of sorting the array in decreasing order of the size of the data, a loading step of sequentially loading the data of as many parts as will fit into memory, a rendering process of sequentially rendering the data of the parts from memory, an update process executed concurrently with the rendering process of removing from memory the data of parts loaded earlier by the update process that have already been rendered in the current rendering pass and loading into memory data of parts yet to be rendered in the current rendering pass, and an auto-optimize process of removing, after each rendering pass, the data of a subset of the parts loaded into the available memory by the loading process.

15 Claims, 9 Drawing Sheets

(56) References Cited

OTHER PUBLICATIONS

Correa et al., "iWalk: Interactive Out-of-Core Rendering of Large Models," Technical Report TR-653-02, 2002, Princeton University.
Gannon et al., "Strategies for cache and local memory management by global program transformation," Journal of parallel and distributed computing, 1998, vol. 5:5, pp. 587-616.

* cited by examiner

US 9,529,942 B1

AUTO-OPTIMIZING OUT-OF-CORE METHOD AND SYSTEM FOR RENDERING OF LARGE ENGINEERING 3D CAD ASSEMBLIES ON HANDHELD DEVICES

CROSS-REFERENCES TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

REFERENCE TO A "SEQUENCE LISTING," A TABLE, OR A COMPUTER PROGRAM LISTING APPENDIX SUBMITTED ON A COMPACT DISC AND AN INCORPORATION-BY-REFERENCE OF THE MATERIAL ON THE COMPACT DISC

Not applicable.

BACKGROUND OF THE INVENTION

Field of the Invention

The present invention relates to an auto-optimizing out-of-core method and system for rendering of large engineering three-dimensional (3D) Computer Aided Design (CAD) assemblies on low-memory handheld devices, wherein the CAD assemblies comprise of a plurality of parts containing triangulated geometry data, and wherein the total size of the part triangulated geometry data exceeds the available random access memory (RAM).

Description of the Related Art

Designers using 3D CAD applications can prototype engineering components and structures much faster because they can visualize and modify the model in 3D and from multiple points of view. 3D CAD additionally enables designers and engineers to test the strength, performance and manufacturability of their designs. This can be done by simulating the response to anticipated forces, animating the interaction between different components, simulating manufacturing process, and performing various other types of analysis on the 3D CAD models. The ability to perform these tests on a digital prototype significantly decreases the time required to design a complex product.

Complex engineering components like the engines, supporting structures and other parts of automobiles, aircrafts and other machinery cannot usually be designed as a single entity. These complex engineering models are therefore modeled as several smaller individual parts, often by big teams of engineers and designers. The individually designed components are then assembled into another CAD design known as a CAD assembly. A CAD assembly can frequently comprise of hundreds if not thousands of parts. When assembled together designers can visualize how the individual parts fit together and interact with each other. Designers and engineers can also perform additional and more complex simulations and analysis on a CAD assembly. For example, they can test if the individual parts will fit properly and if they will work together in practice.

Essential to all these activities is the ability to visualize CAD parts and assemblies in 3D on digital screens and monitors. Usually most engineering CAD models are designed using continuous parametric surfaces and solids. However, for the purpose of viewing them in 3D these parametric surfaces need to be triangulated into a set of discrete triangles. This is because popular 3D programming application-programming-interfaces (APIs) like OpenGL expect the input data to be in a triangulated form for performance reasons. Triangulation methods approximate a parametric surface by a connected set of triangles within some given tolerance. The smaller the tolerance the greater the number of triangles that are required to approximate the surface.

3D CAD applications usually store the CAD geometry data to disk in their native parametric format. However, there are also several formats, like STL and OBJ, which store the geometry data in a triangulated format suitable for rendering in 3D. Additionally, there are several open source and commercial libraries which can triangulate parametric 3D CAD data. For the purposes of the current invention we will assume that the CAD geometry data is already available in a triangulated format.

For rendering in 3D the triangulated geometry data of a part is preferably first copied from the storage device into the random access memory. This is because reading and rendering data from the random-access-memory is an order of magnitude faster than reading data from a storage device like a hard disk. It is therefore preferable to load all the triangulated geometry data in memory before rendering.

There are however cases in which the size of the triangulated geometry data comprising a 3D CAD assembly can be larger than the size of the available memory. In these situations a portion of the triangulated geometry data can be read directly from disk and then rendered. Such rendering methods are known as out-of-core rendering methods, where out-of-core means outside of random access memory. Because these methods read a portion of the triangulated geometry data from disk, out-of-core rendering methods tend to be much slower. To mitigate this drop in performance, out-of-core rendering methods are clubbed with various optimization techniques.

Handheld mobile devices, like smartphones and tablets, are growing in popularity. Designers and engineers frequently need to share 3D CAD models for review with each other and sales people often need to showcase 3D CAD models to customers and partners. The ability to visualize 3D CAD models on the go on handheld mobile devices can therefore enhance collaboration, thus enabling rapid product development and sales.

Because handheld devices are very compact and lightweight, they currently have limited random access memory and processing power due to space and battery constraints. The total size of the triangulated geometry data comprising a large 3D CAD assembly can therefore often exceed the size of the available RAM in a handheld device. A trivial rendering method that loads the complete triangulated geometry data from disk into the RAM therefore won't be able to render the complete CAD assembly on such devices.

Mesh simplification is a technique where the triangulated data is simplified or reduced by combining or collapsing multiple connected triangles into a single larger triangle. However, the lesser the number of triangles used to approximate a parametric surface the lower the accuracy of representation. When a mesh simplification technique combines multiple triangles into a single triangle, it does reduce the size of the triangulated geometry data but at the cost of reduced accuracy. (See: Kok-Lim Low, Tiow-Seng Tan. Model Simplification Using Vertex Clustering. Proceedings of the 1997 symposium on Interactive 3D graphics, 1997). Mesh simplification, beyond a certain extent, can also result in significant loss of geometric detail.

There are some runtime techniques which can also reduce the amount of triangulated data that needs to be stored in memory. Frustum culling is a technique where the data outside the user's viewport is filtered out and not rendered. Occlusion culling is another technique where a geometry that is hidden by another geometry from the current point of view is not rendered. While these techniques are primarily used to improve the rendering performance, they can also reduce the amount of triangulated geometry data that needs to be loaded at a time into the random access memory (See: T. Hudson, D. Manocha, J. Cohen, M. Lin, K. Hoff, and H. Zhang. Accelerated occlusion culling using shadow frusta. SCG '97 Proceedings of the thirteenth annual symposium on Computational geometry, 1997). Because these techniques need to be applied at runtime during the rendering process, they can be computationally too intensive for a handheld device. These techniques therefore has the potential to slow down the rendering on a hand-held device instead of making it faster.

Out-of-core methods can be used to process large data when there is limited available memory (See: Jeffrey Scott Vitter, External memory algorithms and data structures: dealing with massive data. ACM Computing Surveys (CSUR) Volume 33 Issue 2, June 2001 Pages 209-271). There are several out-of-core rendering techniques focused on interactive rendering, and they often use a combination of filtering and simplification techniques to reduce the triangulated geometry data (See: W. T. Correa, J. T. Klosowski, and C. T. Silva. iWalk: Interactive Out-Of-Core Rendering of Large Models. Technical Report TR-653-02, Princeton University, 2002).

Many of the parts comprising a typical engineering 3D CAD assembly are however visible from many points of view. This decreases the effectiveness of filtering techniques which are more useful while rendering architectural and other large scale models. Moreover filtering techniques are useful when the rending point of view is located within the model or a scene where the field of view is narrow and where the scene is projected in perspective. In the case engineering CAD models however the point of view is almost always outside the model and the scene is usually rendered in an orthographic projection. Engineering 3D CAD models also require precise visualization, and therefore model simplification, beyond a certain level, is undesirable. Filtering and simplification techniques also require extensive pre-processing and runtime computations. This can slow down both the loading of the file and the rendering on a handheld device.

A trivial implementation of an out-of-core rendering technique, where a portion of the triangulated geometry data is rendered from memory and the rest directly from a storage device, may be too slow for large CAD assemblies. This is because accessing data directly from the disk during rendering can be extremely slow. It is possible to increase the efficiency of such a system by using a part of the memory to cache the triangulated geometry data that would otherwise be read directly from disk. This cache can be updated by a concurrently running process which can remove rendered parts from the cache and load the triangulated geometry data for the yet to be rendered parts into the cache. The rendering process can then render most of the parts from the cache instead of the storage device, thus improving the rendering speed. It is however difficult to determine an optimum size for such a cache (See: Gannon, Dennis, William Jalby, and Kyle Gallivan. "Strategies for cache and local memory management by global program transformation." Journal of parallel and distributed computing 5.5 (1988): 587-616).

BRIEF SUMMARY OF THE INVENTION

The present invention is a system for rendering the geometry data of a 3D CAD assembly including a plurality of parts, each of the plurality of parts including triangulated geometry data suitable for rendering.

The system comprises of a computing device; a data storage device in communication with the computing device and storing the data of the CAD assembly; an input device in communication with the computing device and receiving input; a display device in communication with the computing device and displaying the triangulated geometry data of the CAD assembly; a memory device in communication with the computing device, the memory device having available memory for temporarily storing a data of a subset of the plurality of parts of the CAD assembly for rendering on the display device; and a program of instructions embodied in a tangible medium, the program of instructions causing the computing device to render the data of the CAD assembly on the display device in response to a request received by the input device.

The program of instructions comprises of a parsing module, a sorting module, a loading module, a rendering module, an update module and a auto-optimize module.

A parsing module creates an array storing the size of the triangulated geometry data and the location on file and in memory of each of the plurality of parts comprising the CAD assembly.

A sorting module sorts the array storing the location and size of the triangulated geometry data of the plurality of parts in descending order of size of the triangulated geometry data.

A loading module sequentially loads the triangulated geometry data of as many parts as will fit into the available memory, starting from the first part in the sorted array.

A rendering module sequentially renders all the parts in the sorted array from memory if the triangulated geometry data of the part is available in memory, else directly from the data storage device.

An update module executes concurrently with the rendering module and removes from memory the triangulated geometry data of parts already rendered by the rendering module and previously loaded into memory by the update module, and loads into memory the triangulated geometry data of parts that are yet to be rendered.

An auto-optimize module executes after each rendering of all the parts by the rendering module and it compares the time taken by the current rendering pass with the time taken by the previous rendering pass, and removes from memory the triangulated geometry data of a subset of the parts loaded into memory by the loading module in case the time taken by the current rendering pass is less than or equal to that of the previous rendering pass.

The loading module, instead of loading the triangulated geometry data of as many parts as possible into memory, can optionally only load a certain fraction of the available memory with triangulated geometry data.

The rendering module optionally only renders the parts whose triangulated geometry data is available in memory and skips rendering the parts whose triangulated geometry data is not available in memory.

The rendering module optionally only renders the parts whose triangulated geometry data is available in memory and renders placeholder wireframe boxes for parts whose triangulated geometry data is not available in memory.

The update module can be invoked periodically from the rendering module.

The update module can also be invoked continuously in the background independent of the rendering module.

The subset of the parts removed by the auto-optimize module can comprise of a large fraction of the part currently in memory and loaded by the loading process.

The auto-optimize module optionally stops further removal of part triangulated geometry data from memory once the time taken by the by the current rendering of all the parts becomes greater than that of the previous rendering of all the parts.

The auto-optimize module of instructions loads into memory a large fraction or a small multiple of the parts currently in memory and loaded by the loading process when the time taken by the current rendering pass is greater than the time taken by the previous rendering pass.

BRIEF DESCRIPTION OF THE DRAWINGS

FIG. 10 also shows the start time and the time taken by the concurrent update process to load parts into the memory during the second rendering pass.

FIG. 11 also shows the start time and the time taken by the concurrent update process to load parts into the memory during the third rendering pass.

DETAIL DESCRIPTION OF EXEMPLARY EMBODIMENTS OF THE INVENTION

Figure 1:
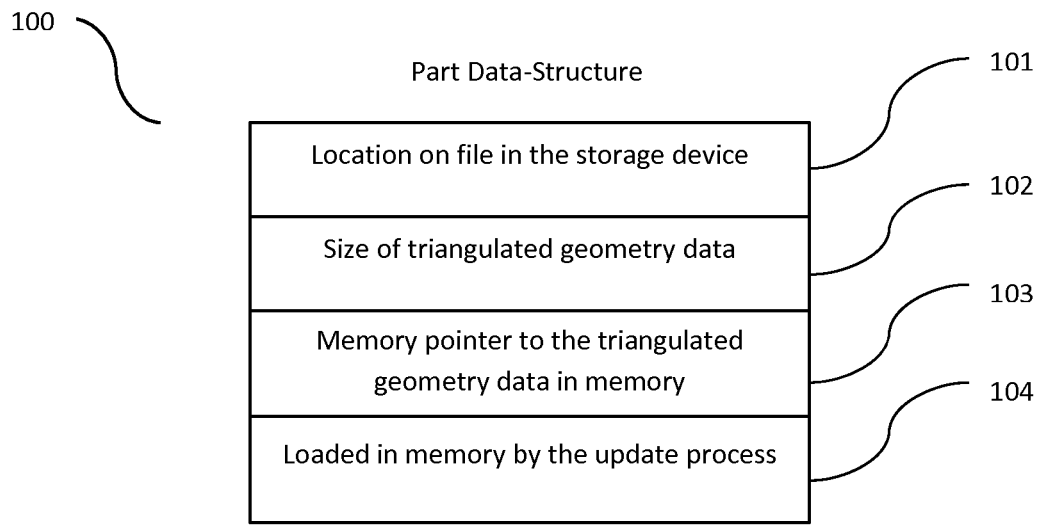
FIG. 1 is an illustrative diagram of the data-structure of a part comprising an engineering CAD assembly, which stores the references to the size and location of the part triangulated geometry data on the storage device and in memory.

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

While the following terms are believed to be well understood by one of ordinary skill in the art, definitions are set forth to facilitate explanation of the presently-disclosed subject matter.

Unless defined otherwise, all technical and scientific terms used herein have the same meaning as commonly understood by one of ordinary skill in the art to which the presently-disclosed subject matter belongs. Although any methods, devices, and materials similar or equivalent to those described herein can be used in the practice or testing of the presently-disclosed subject matter, representative methods, devices, and materials are now described.

Following long-standing patent law convention, the terms "a", "an", and "the" refer to "one or more" when used in this application, including the claims. Thus, for example, reference to "a cell" includes a plurality of such cells, and so forth.

Unless otherwise indicated, all numbers expressing quantities of parts, size of data, time to complete a rendering pass, and so forth used in the specification and claims are to be understood as being modified in all instances by the term "about." Accordingly, unless indicated to the contrary, the numerical parameters set forth in this specification and claims are approximations that can vary depending upon the desired properties sought to be obtained by the presently-disclosed subject matter.

The terms "computing device" or "processing device" are used herein to describe one or more microprocessors, microcontrollers, central processing units, Digital Signal Processors (DSPs), Field-Programmable Gate Arrays (FPGAs), Application-Specific Integrated Circuits (ASICs), or the like for receiving input data, executing instructions on the input data to create result data, and outputting the result data.

The term "memory device" is understood to mean a physical device (computer readable media) used to store data for use in a computer or other digital electronic device, including primary memory used for the information in physical systems which are fast (i.e. RAM). The term "memory" is often (but not always) associated with addressable semiconductor memory, i.e. integrated circuits consisting of silicon-based transistors, used for example as primary memory but also other purposes in computers and other digital electronic devices. Semiconductor memory includes both volatile and non-volatile memory. Examples of non-volatile memory include flash memory (sometimes used as secondary, sometimes primary computer memory) and ROM/PROM/EPROM/EEPROM memory. Examples of volatile memory include dynamic RAM memory, DRAM, and static RAM memory, SRAM.

The term "available memory" is understood to mean the free primary memory (e.g., random access memory (RAM)). The computing device tracks the amount and location of the available memory.

The term "data storage device" is understood to mean a physical device (computer readable media) used to store data on a non-transient basis for use in a computer or other digital electronic device, including secondary memory, which are physical devices for program and data storage which are slow to access but offer higher memory capacity. Traditional secondary memory includes tape, magnetic disks and optical discs (CD-ROM and DVD-ROM).

The term "triangulated geometry data" is used herein to describe a set of connected triangles (also commonly known as a mesh of triangles) used to approximate a parametric surface for the purpose of rendering in 3D using a standard programming API like OpenGL. For example, a square planar surface can be approximated by two right angled triangles connected at and sharing a common hypotenuse. In this case the two triangles accurately model the square planar surface, but if the surface is not planar, then the triangles will only be able to approximate the surface.

The term "out-of-core" is used herein to describe outside of the memory (i.e., "out-of-core" triangulated geometry data must be accessed from the data storage device during a rendering pass).

A "rendering pass" is used herein to describe a single iteration of the rendering process which is necessary to create a single rendered frame of the 3D CAD assembly which can then be displayed on screen. During a rendering pass the rendering process renders each part comprising the CAD assembly in a per-defined order either from memory or directly from the storage device.

An exemplary embodiment of the present invention includes an auto-optimizing out-of-core system for rendering of a complete engineering 3D CAD assembly that consists of a plurality of 3D CAD parts containing triangulated geometry data. The present invention is suitable for a handheld device such as a smartphone or a handheld tablet where the memory and processing power are often an order of magnitude less than that of laptop and desktop computers. This system is designed for an assembly that consists of at least hundreds of CAD parts, each part containing triangulated geometry data, where the total size of the part triangulated geometry data exceeds the random access memory (RAM) available to the system. As discussed below, the exemplary system is able to render the full triangulated geometry data quickly by optimizing how the available RAM is utilized.

The present invention uses two simple data-structures to store and manage the information required to render the parts comprising the CAD assembly. A part data-structure stores 4 values. One value stores the location on file of the triangulated geometry data of the part. Another value stores the size of the triangulated geometry data of the part. Yet another value stores a memory pointer to the location in memory of the copy of the triangulated geometry in case it has been loaded into memory. The last value stores whether the part has been loaded by the update process. The update process is an essential part of the present invention and is described in detail later.

The part data-structures for all the parts comprising the CAD assembly is stored in an array data-structure in memory. This array data structure stores the part data-structure entities in contiguous memory locations, which makes it fast and easy to jump to a particular location and query the part data-structure of a particular part.

Broadly, the system comprises of 5 steps or processes. The parsing step parses the file containing the triangulated geometry data of the parts and populates the data-structures for the parts and the array. The sorting step sorts the part data-structures contained in the array data-structure. The loading step loads the triangulated geometry data for a subset of the parts into memory. The rendering process renders the parts on screen. The update process executes concurrently with the rendering process and it removes from memory the triangulated geometry data of parts that have already been rendered and which were loaded earlier by the update process, and loads into memory the triangulated geometry data of the parts yet to be rendered. The auto-optimizing process incrementally removes from memory the triangulated geometry data of the parts loaded by the initial loading step and thus controls and optimizes the amount of memory available to the update process.

A parsing step includes reading the location on file and the size of the triangulated geometry data for each part. The parsing step stores this in the part data-structure. The parsing step also sets the memory pointer in the part data-structure to 0 indicating that the pointer is invalid and that the part triangulated geometry data has not been loaded into memory yet. Additionally, the parsing step sets the value indicating whether the part data was loaded in memory by the update process to false.

A sorting step includes sorting the part data-structure entities contained inside the array data-structure in descending order of the size of their triangulated geometry data. After the sorting step completes the array data-structure will have the part with the largest triangulated geometry data as the first part and the rest of the parts will follow in the order of decreasing size of the triangulated geometry data.

The purpose of sorting the list of parts is to ensure that the largest, and therefore often the most important parts comprising the CAD assembly are rendered first. More importantly, the parts comprising a typical engineering CAD assembly have an exponential distribution when ordered with respect to size. Such a distribution enables the optimization algorithm described in the context of the rendering process below to converge rapidly.

A loading step includes loading the triangulated geometry data of as many parts starting from the first part in the sorted array data-structure, as will fit into the remaining available memory (i.e., the available memory that is not occupied by the array of the parts comprising the assembly). When the loading step copies the triangulated geometry data for a part into memory, it also sets the memory pointer in the part data-structure for the part to point to this copied triangulated geometry data in memory.

The parsing, sorting and loading steps are executed only once per CAD assembly.

Whenever the system needs to update the rendering data displayed on the display device it executes a rendering pass. Before the start of each rendering pass the rendering process calls the update process once. During a rendering pass the rendering process loops through all the parts in the array data-structure starting from the first part and renders each part sequentially. The rendering process checks if the memory pointer in the part data-structure for these parts are valid, in which case it renders the triangulated geometry data from memory else renders the data directly from the storage device. If the part triangulated geometry data was loaded in memory by the update process, then after rendering the part the rendering process calls the update process again. At the end of each rendering pass the rendering process calls the auto-optimize process.

After rendering each part the rendering process updates a shared variable in memory in which it stores the position P (i.e. the position in the sorted array) of the last rendered part. This shared variable is used by the update process to update the available memory.

The update process, when invoked, executes in a different thread concurrently with the rendering process. The update process loops through all the parts in the array data-structure checking is the triangulated geometry data of the part was loaded by the update process. If the part data was loaded by the update process the update process then check if the part is less than or equal to the last rendered part P. If the part is less than or equal to P then the triangulated geometry data for the part is removed from memory, else the update process tries to load the part into memory by first checking if the size of the triangulated geometry data of the part is less than that of the available memory. When the update process removes the triangulated geometry data of a part from memory it sets the memory pointer in the part data-structure of the part to 0.

When the update process loads the triangulated geometry data of a part into memory it also sets the memory pointer in the part data-structure of the part to point to the location in memory where the data was loaded, additionally it also set the value in the part data-structure indicating whether the part triangulated geometry data was loaded by the update process to true. The update process exits when it encounters a part that is too big to fit into the available memory or when it has reaches the last part in the array.

If an update process is already running then another update process is not executed by the system. The update process checks at the start if another update is in progress, in which case it exists immediately.

The auto-optimization process tracks the time taken by each rendering pass of the rendering process. It is invoked by the rendering process at the end of each rendering pass. Let the time taken by the current pass be denoted by T, and the time taken by the previous passes be denoted by $T_{-1}$. During the first rendering pass $T_{-1}$ is set to infinity or the maximum possible value that the variable storing $T_{-1}$ can store. Also, during the first rendering pass, a variable AO indicating whether the process should continue to auto-optimize is set to true.

At the end of each rendering pass when the auto-optimize process is invoked, it checks whether $T<=T_{-1}$ (i.e. whether the time taken by the current rendering pass was less than or equal to the last rendering pass) and if auto-optimization is on (i.e. if the variable AO is true), in which case it removes the latter half of the parts which were present in memory at the start of the rendering pass. If however $T>T_{-1}$ then the auto-optimize process sets the auto-optimize variable AO to false, and then loads into the available memory as many more parts, starting from the part after the last part in memory, as where available in memory at the start of the rendering pass. Additionally, when the auto-optimize process loads the triangulated geometry data of parts into memory it sets the memory pointer of the part data-structure to point to the location in memory where the data was loaded, and it sets the value indicating whether the part triangulated geometry data was loaded by the update process to false.

The auto-optimize process instead of removing half of the parts in memory, can remove a different predetermined large fraction of the parts from memory. This predetermined large fraction should preferably lie somewhere between ¼ and ¾. Deleting a large fraction, of the parts from memory at the end of each rendering pass results in fast optimization. For example, even if there are a hundred thousand parts in the assembly, a near optimal use of memory can be obtained in less than 16 rendering passes if half the permanent parts are removed during auto-optimization on each rendering pass. This is because in 16 rendering passes the auto-optimize process would have removed all the parts from memory and a near optimal utilization of memory is bound to be found somewhere in between.

Because the number of parts increases exponentially as the triangulated geometry data decreases, removing a pre-determined large fraction (e.g., ½, ⅙, ¼) of the parts loaded in memory after each rendering pass, actually only removes a small and approximately fixed amount of the total triangulated geometry data from the memory in each rendering pass and this causes the auto-optimization process to converge rapidly without sacrificing a lot of accuracy.

The present invention relates to a fast but not necessarily interactive method for rendering of complete engineering CAD models. However, the present method can be easily extended to incorporate interactive rendering. When interactive rendering is required, for example when reorienting the point of view for rendering, the auto-optimize process can be temporarily paused and the rendering process can render only as many parts as possible within a given time frame in order to maintain the desired frame rate.

FIG. 1 shows an illustrative diagram of a part data-structure 100 which stores in memory the details of a particular part in the CAD assembly. The part data-structure includes: a value 101 storing the location on file in the storage device of the triangulated geometry data for the part, a value 102 storing the size of the triangulated geometry data for the part, a value storing the memory pointer 103 of the location in memory where the triangulated geometry data for the part has been copied, and a value 104 storing whether the triangulated geometry data for the part was loaded in memory by the update process. For parts whose triangulated geometry data is not copied into memory the memory pointer 103 is set to 0 indicating that the memory location is not valid.

Figure 2:
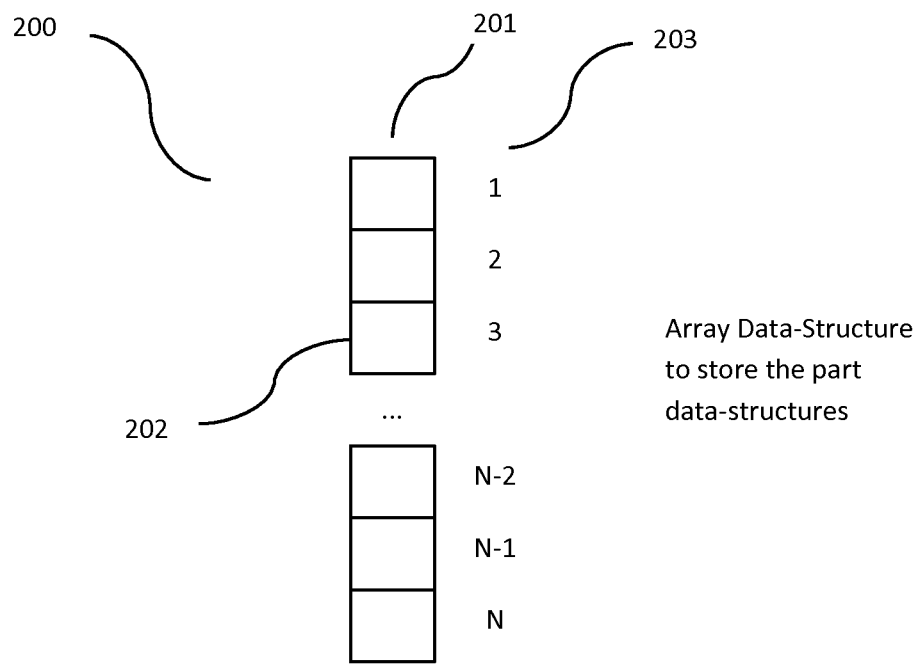
FIG. 2 is an illustrative diagram of the array data-structure which stores the references to the part data-structures 100 (FIG. 1) for the parts comprising the engineering CAD assembly.

FIG. 2 shows an illustrative example of the array data-structure 200 which stores the part data-structures of all the parts comprising the CAD assembly. The array data-structure consists of linearly arranged slots 201 which are located contiguously in memory. Each slot 202 has the same size as the part data-structure 100 (FIG. 1), and each slot 202 stores an instance of the part data-structure. Because the slots 201 in memory are linearly arranged and of a fixed size, any one of them can be accessed quickly via their positions in the array 203.

Figure 3:
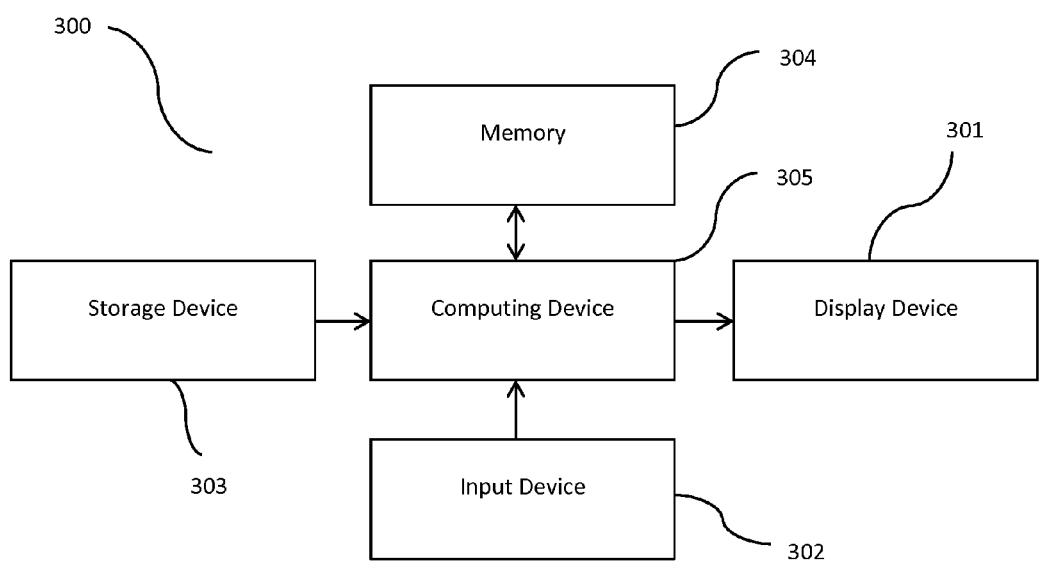
FIG. 3 is a block diagram of an exemplary auto-optimizing out-of-core system for rendering of engineering CAD assemblies.

FIG. 3 is a block diagram which shows an exemplary auto-optimizing and out-of-core system 300 (i.e., a handheld device) for rendering of large engineering CAD assemblies, including: a display device 301, an input device 302, a data storage device 303, a memory device 304 and a computing or processing device 305. All of the components are integral with each other and with the system 300 (i.e., the components are part of the handheld device). The display device 301 (such as a monitor) displays the rendered triangulated geometry data. The input device 302 (such as a keyboard, mouse or touch screen) receives input from the user. The storage device 303 (such as a hard disk or a solid-state drive) contains the CAD triangulated geometry data to be rendered. A copy of a portion of the CAD triangulated geometry data is also stored in the memory device 304. The computing device 305 (such as a CPU, microprocessor, microcontroller, digital signal processor, graphics processing unit or field-programmable gate array) is explained in further detail in the context of FIG. 4.

Figure 4:
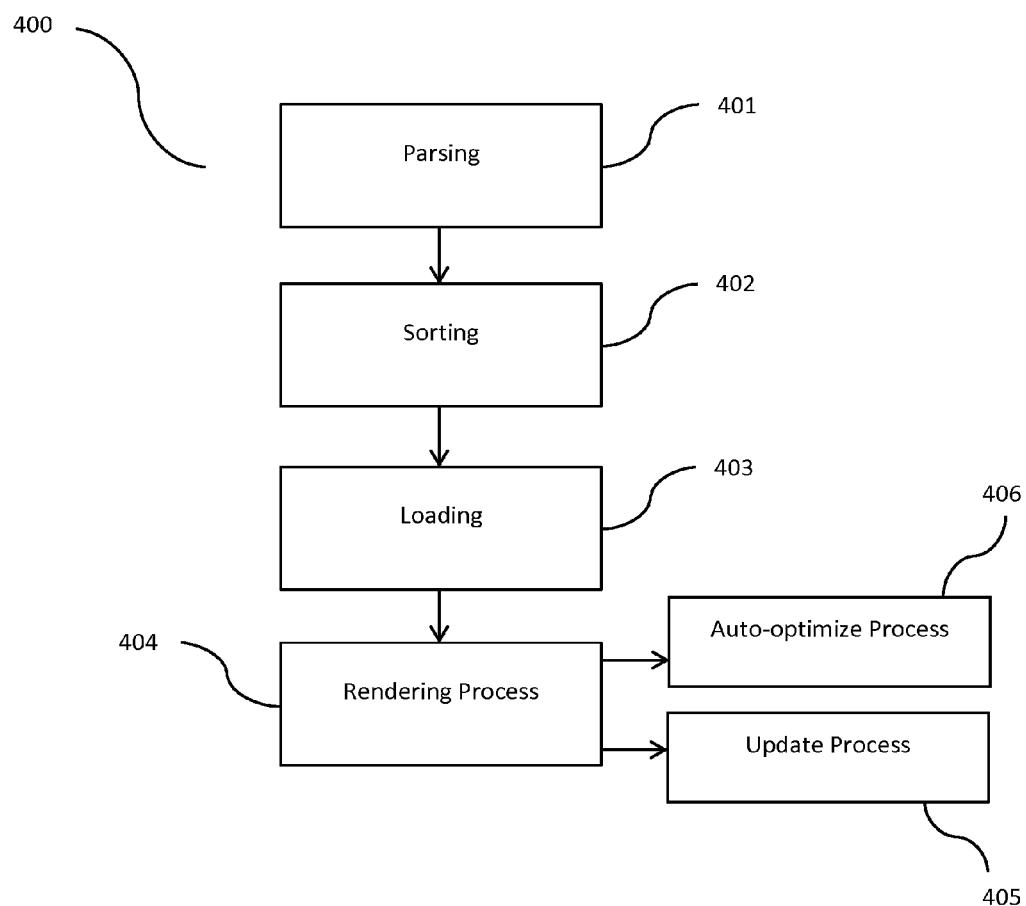
FIG. 4 is a block diagram of an exemplary auto-optimizing out-of-core method for rendering of engineering CAD assemblies.

FIG. 4 is a block diagram, generally designated as 400, which shows an exemplary auto-optimizing and out-of-core method 400 for rendering of engineering CAD assemblies, the method comprising: a parsing step 401, a sorting step 402, a loading step 403, a rendering process 404, an update process 405, and an auto-optimize process 406.

The parsing step 401 reads the CAD assembly file from the storage device 303 (FIG. 3), and for each part it encounters creates and populates a part data-structure 100 (FIG. 1) and stores it in the array data-structure 200 (FIG. 2). The parsing step 401 sets the value 101 (FIG. 1) storing the location on file of the triangulated geometry data of the part. The parsing step 401 also sets the value 102 (FIG. 1) storing the size of the triangulated geometry data. The parsing step 401 sets the memory pointer 103 (FIG. 1) to 0 and it sets the value 104 (FIG. 1) indicating whether the part has been loaded in memory by the update process to false.

The sorting step 402 sorts the part data-structures 100 (FIG. 1) present in the array data-structure 200 (FIG. 2) in descending order based on value 102 (FIG. 1) storing the size of the triangulated geometry data.

The loading step 403 loads the part triangulated geometry data from the storage device 303 (FIG. 3) into memory 304 (FIG. 3). Starting from the first part in the sorted array 200 (FIG. 2), the loading step 403 reads the locations on file of the triangulated geometry data of the part from the value 101 (FIG. 1) and it copies the part triangulated geometry data of as many parts as can be copied into the available memory. If a part triangulated data is successfully copied into memory, then the loading step 403 also sets the memory pointer 103 (FIG. 1) in the part data-structure for the said part to point to the location in memory where the part triangulated data was copied.

The rendering process 404 reads the triangulated geometry data of the parts which are loaded in memory from the memory 304 (FIG. 3) and for the rest of the parts it reads the triangulated geometry data directly from the storage device 303 (FIG. 3), and it renders the triangulated geometry data of the parts on the display device 301 (FIG. 3). During rendering, the rendering process also keeps updating the last rendered part P stored in a shared variable in the memory 304 (FIG. 3). The shared variable storing the last rendered part P is used by the update process 405 (FIG. 4) to update the triangulated geometry data of the parts in memory.

A rendering pass is invoked on user input. For example when the point-of-view of the rendering is changed the rendered scene needs to be updated and a new rendering pass is started. After a rendering pass ends, the rendering process 404 waits for user input before it starts the next rendering pass. The rendering process 404 can also be started when the render window is resized or when other overlapping windows are moved. The rendering process 404 is discussed in more detail in the context of FIG. 5 below.

The update process 405 is invoked from the rendering process 404 at the start of each rendering pass and whenever the rendering process renders a part whose triangulated geometry data was loaded by the update process. The update process 405 updates the triangulated geometry data in memory 304 (FIG. 3) with new triangulated geometry data from parts that are yet to be rendered in the current rendering pass. The update process loops through all the pars checking if a part was loaded by the update process. If a part was loaded by the update process and has already been rendered (i.e. its position in the sorted array is less than or equal to the last rendered part P) the update process 405 removes the part's triangulated geometry data from memory 304 (FIG. 3), else if the part is yet to be rendered (i.e. its position in the sorted array is greater than the last rendered part P) the update process 405 tries to load the part in memory 304 (FIG. 3) after checking if the size of the triangulated geometry data for the part is less than that of the available memory. The update process 405 is discussed in more detail in the context of FIG. 6 below.

The auto-optimize process 406 is executed at the end of each rendering pass and it keeps track of the time taken by the rendering process 404 (FIG. 4). During the first rendering pass the auto-optimize process 406 sets an auto-optimization variable AO to true, and set the time taken by the last rendering pass $T_{-1}$ to infinity or the maximum value that the variable storing $T_{-1}$ can take. After each rendering pass the auto-optimize process 406 checks if the time taken by the current rendering pass is less than or equal to the last rendering pass. If the time taken by the current pass is less than or equal to that of the previous pass (i.e. $T<=T_{-1}$) and if auto-optimization is on (i.e. the auto-optimize variable AO is true), the auto-optimize process removes half of the parts that were in memory at the beginning of the rendering pass. If however the time taken by the current pass is more than that of the last pass (i.e. $T>T_{-1}$), the auto-optimize process turns off the auto-optimization (i.e. it sets the auto-optimize variable AO to false) and additionally the auto-optimize process further loads as many additional parts into memory as were present in memory at the start of the rendering pass. The auto-optimize process 406 is discussed in more detail in the context of FIG. 7 below.

Figure 5:
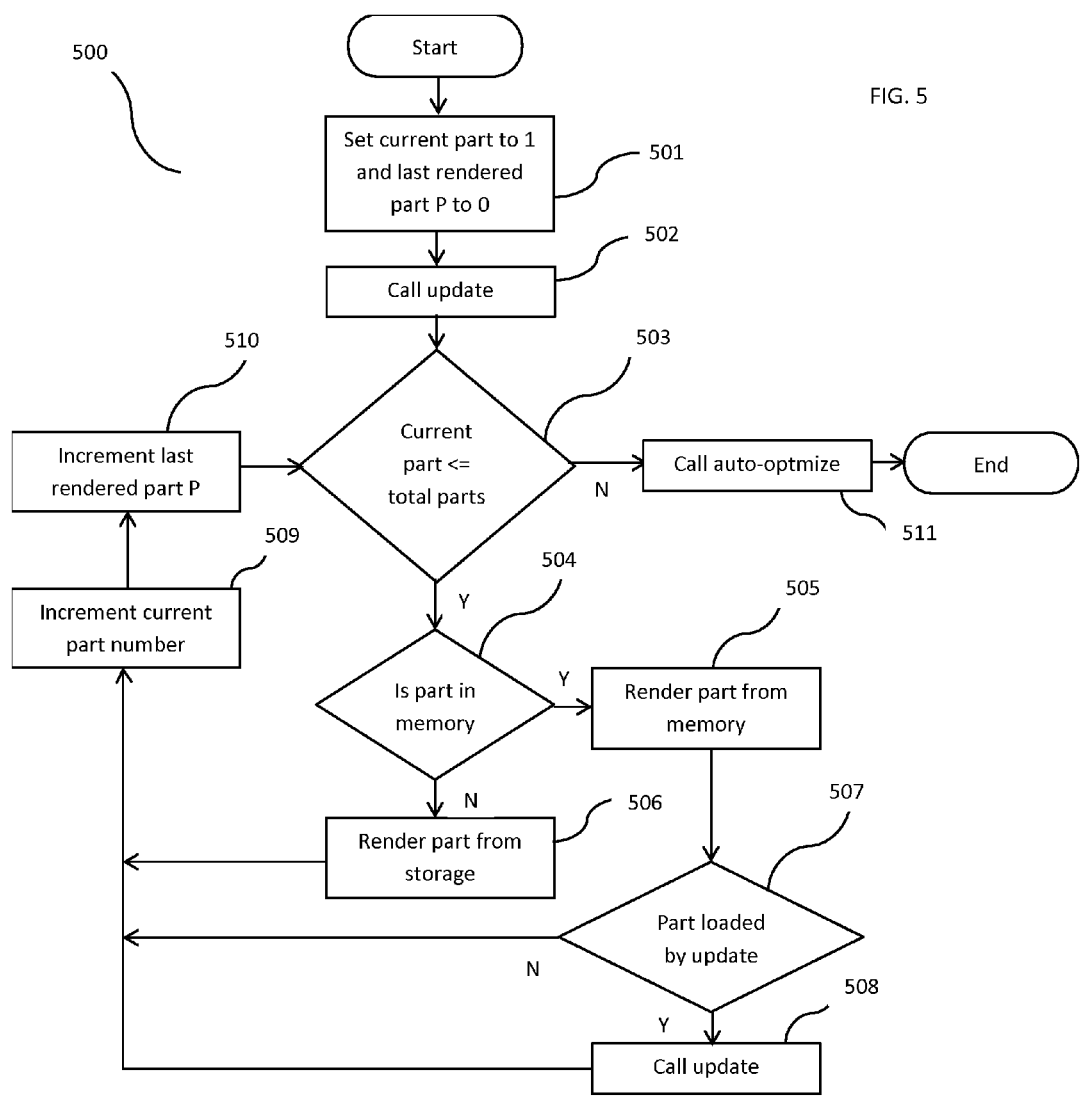
FIG. 5 is a flow chart showing in detail an exemplary rendering pass of the rendering process, which is a part of an exemplary auto-optimizing and out-of-core computer-implemented method for rendering of engineering CAD assemblies.

FIG. 5 is a flow chart, generally designated as 500, showing an exemplary rendering pass of the rendering process 404 (FIG. 4).

The step 501 includes setting the current part to 1 and setting the shared variable storing the last rendered part P to 0.

The step 502 includes calling the update process just before the actual rendering of the parts begins.

The step 503 includes checking if the current part is less than or equal to the total number of parts in the part array. If the current part is less than or equal to the total number of parts then the process continues to step 504, else the process continues to the step 511.

The step 504 includes checking if the memory pointer in the part data-structure 100 (FIG. 1) of the part is valid, thus indicating that the triangulated geometry data current part is available in the memory 304 (FIG. 3). In case the triangulated data for the current part is available in memory the rendering process continues to step 505, else it continues to the step 506.

The step 505 renders the triangulated geometry data of the part from memory.

The step 506 renders the triangulated geometry data of the part directly from the storage device.

The step 507 includes checking whether the triangulated geometry data of the part was loaded in memory by the update process. This can be determined by checking if the value 104 (FIG. 1) in the part data-structure 100 (FIG. 1) of the part is set to true. If the triangulated geometry data of the part was loaded in memory by the update process then the rendering process continues to step 508, else it continues to step 509.

The step 508 calls the update process.

The step 509 increments the current part number by 1.

The step 510 increments the last rendered part number P by 1 and continues back to the step 503.

The step 511 calls the auto-optimize process.

Figure 6:
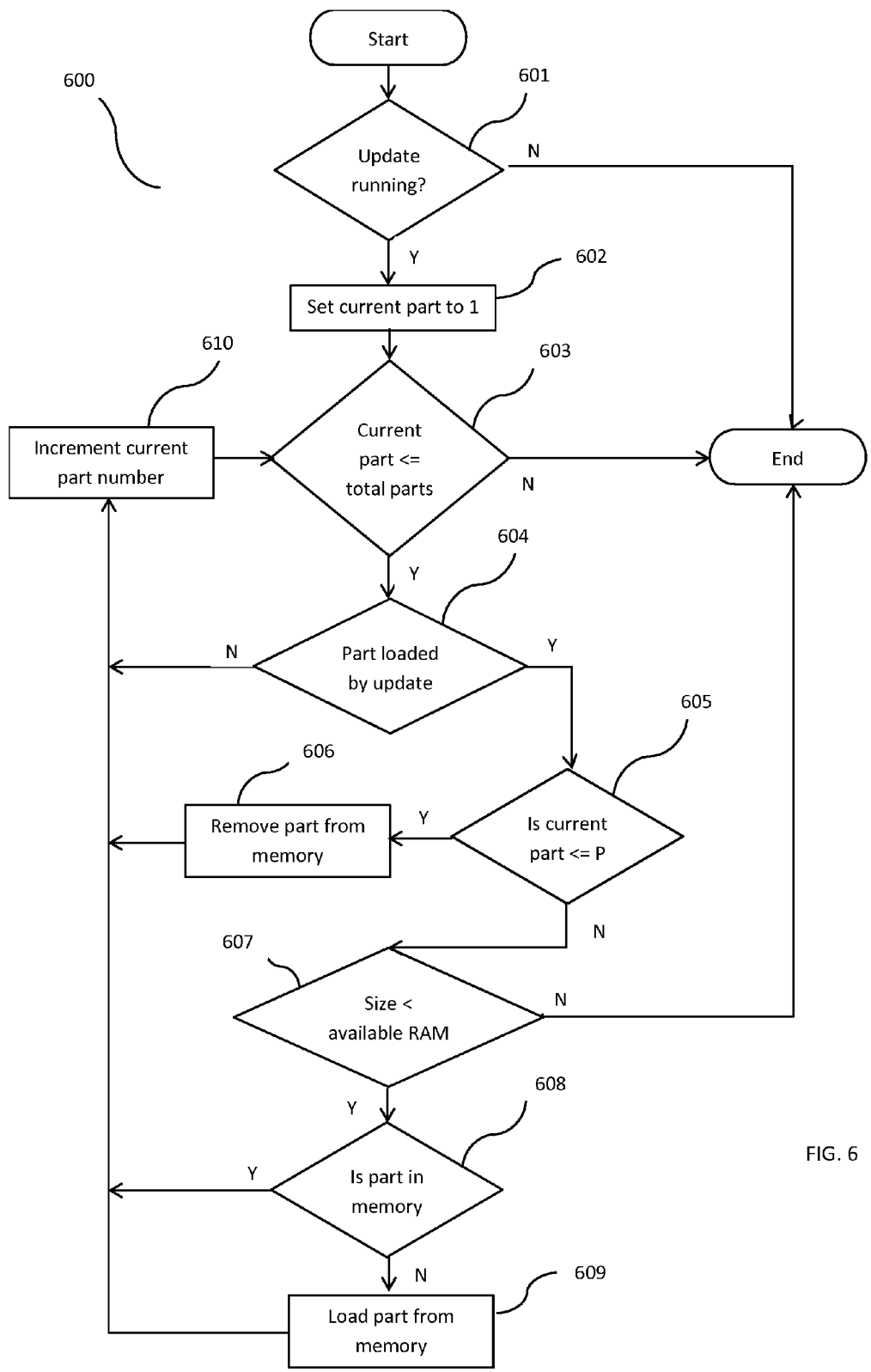
FIG. 6 is a flow chart showing in detail an exemplary update process, which is a part of an exemplary auto-optimizing and out-of-core computer-implemented method for rendering of engineering CAD assemblies.

FIG. 6 is a flow chart, generally designated as 600, showing an exemplary update process 405 (FIG. 4).

The step 601 involves checking whether another update process is currently running. If another update process is running then the update process exits, else the update process continues to step 602.

The step 602 sets the current part to 1.

The step 603 includes checking if the current part is less than or equal to the total number of parts in the array 200 (FIG. 2). If the current part is less than or equal to the total number of parts, then the process continues to step 604, else the update process exits.

The step 604 includes checking if the triangulated geometry data for the current part was loaded by the update process. This can be determined by checking whether the value 104 (FIG. 1) is set to true. If the triangulated geometry data for the current part was loaded into memory by the update process then the process continues to step 605, else it continues to step 610.

The step 605 includes checking if the position of the current part in the sorted array is less than the last rendered part P. If the current part position is less than the last rendered part P the process continues to step 606, else it continues to step 607.

The step 606 involves removing the triangulated geometry data of the current part from the memory 304 (FIG. 3) and setting the memory pointer 103 (FIG. 1) in the part data-structure for the current part to 0. Additionally, the step 606 also sets the value 104 (FIG. 1) indicating whether the part triangulated geometry data was loaded in memory by the update process to false.

The step 607 includes checking whether the size of the triangulated geometry data of the current part is less than the available memory. In case the size of the triangulated geometry data of the current part is less than the available memory, the process continues to step 608, else the process ends.

The step 608 includes checking whether the current part is already loaded in memory. This can be done by checking if the memory pointer 103 (FIG. 1) in the part data-structure 100 (FIG. 1) is non-zero. If the current part is already loaded in memory the update process continues to step 610, else it continues to step 609.

The step 609 loads the triangulated geometry data for the current part into the available memory, and sets the memory pointer 103 (FIG. 1) in the part data-structure 100 (FIG. 1) of the current part to point to the location in memory where the data was loaded. Additionally, step 609 sets the value 104 (FIG. 1) indicating whether the triangulated geometry data for the part was loaded by the update process to true.

The step 610 increments the current part number by 1 and continues to step 603.

Figure 7:
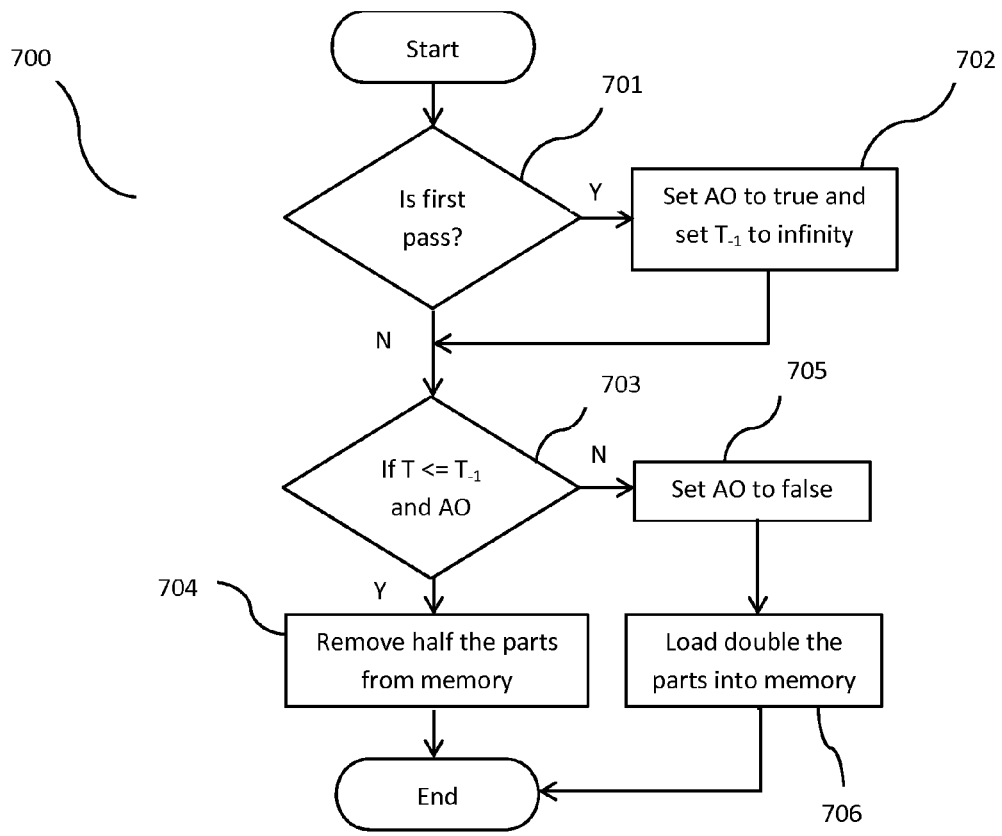
FIG. 7 is a flow chart showing in detail an exemplary auto-optimizing process, which is a part of an exemplary auto-optimizing and out-of-core computer-implemented method for rendering of engineering CAD assemblies.

FIG. 7 is a flowchart, generally designated as 700, showing an exemplary auto-optimize process.

The step 701 involves checking if the current rendering pass is a first pass for the current CAD assembly. If this is the first rendering pass the auto-optimize process continues to step 702, else it continues to step 703.

The step 702 includes setting the auto-optimize variable to true, indicating that the process should auto-optimize, and setting the time taken by the last rendering pass $T_{-1}$ to infinity or to the maximum value possible for the variable storing the value $T_{-1}$.

The step 703 includes checking if the time taken by the current rendering pass is less than or equal to the last rendering pass (i.e. if $T<=T_{-1}$) and if the auto-optimize variable AO is set to true indicating that auto-optimization is on. If $T<=T-1$, the process continues to step 704, else it continues to step 705.

The step 704 removes the latter half the parts, which were present in memory at the start of the rendering pass and which were loaded initially by the loading process, from memory.

The step 705 sets the auto-optimize variable to false, indicating that the process should no longer auto-optimize in the future rendering passes.

The step 706 loads into memory as many additional parts as were available in memory at the start of the rendering process thus doubling the number of parts in memory and bringing the memory utilization to the state in the last rendering pass.

FIG. 8-11 show an illustrative example of an auto-optimizing and out-of-core computer-implemented method for rendering of engineering CAD assemblies. In these figures the triangulated data size and the available memory size are specified in megabytes (MB). Also, the time in all the figures are specified in milliseconds (ms). Additionally, it is assumed that there is 250 MB of available memory. The speed of reading data from memory is assumed to be 1 MB/ms. The speed of reading from the storage device is assumed to be 0.125 MB/ms and the speed of rendering is assumed to be 0.5 MB/ms.

Figure 8:
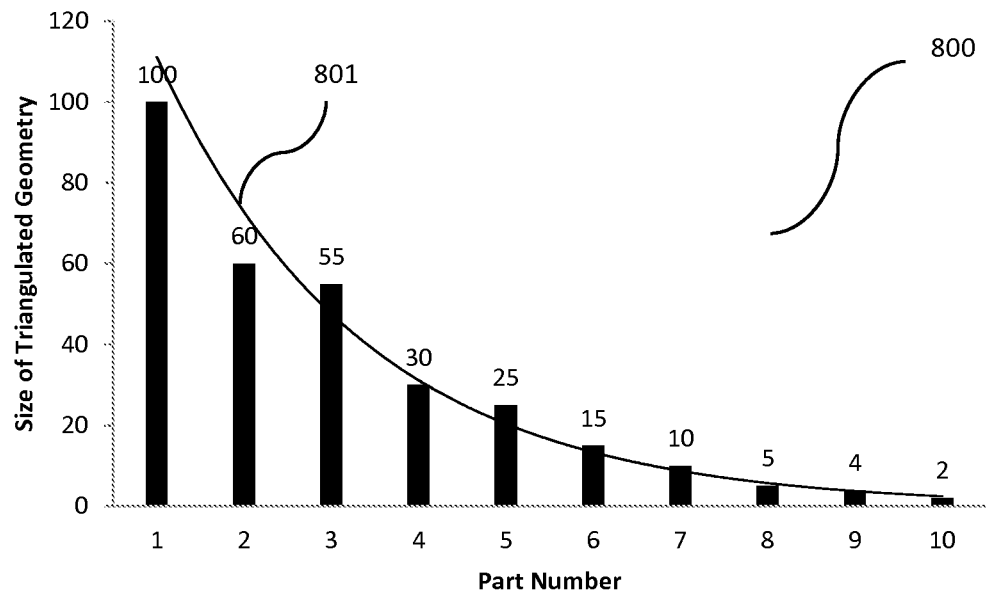
FIG. 8 is a graph showing the sorted list of parts and their size for an illustrative engineering CAD assembly.

FIG. 8 is a graph, generally designated as 800, showing the sizes of parts comprising an exemplary CAD assembly sorted with respect to the size of their triangulated geometry data. Typically CAD assemblies contain a much larger number of parts, however this illustrative example which has only 10 parts comprising the CAD assembly has been chosen to facilitate the explanation of how the rendering process, the update process and the auto-optimize process work and interact.

The line 801 is a trend-line, which shows that the parts sizes follow approximately an exponential distribution. Such a distribution is typical of large CAD assemblies.

Figure 9:
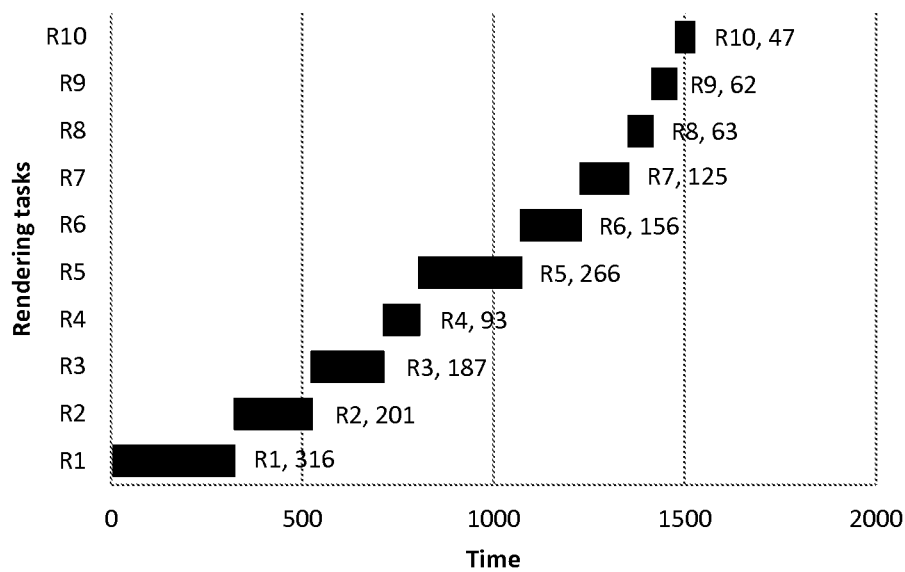
FIG. 9 is a bar chart showing the start time and the time taken by the rendering process in the first rendering pass to render each part comprising the illustrative engineering CAD assembly shown in FIG. 8.

FIG. 9 is a bar graph showing the start time and the time taken to render each part and the order of rendering of the parts in the first rendering pass of the rendering process. The length of the bars indicates the time taken to render a particular part, and the start of the bar indicates the start time of rendering for the said part.

The total time taken by the rendering process in this first rendering pass is around 1525 ms. Because there is 250 MB of available memory only the first 4 parts (i.e. the parts with sizes 100, 60, 55, 30 from FIG. 8, the total size of which comes to 245 MB) were loaded into the memory by the loading process 403 (FIG. 4). The rendering process 404 (FIG. 4) therefore renders the first 4 parts from memory and the rest directly from the storage device. This is apparent from the jump in the time taken (from 93 ms to 266 ms) by the rendering process when rendering the $5^{th}$ part R5 (FIG. 9). Because the parts are ordered with respect to size the rendering time should decrease from one part to the next, unless one part is rendered from memory and the next from the storage device.

Figure 10:
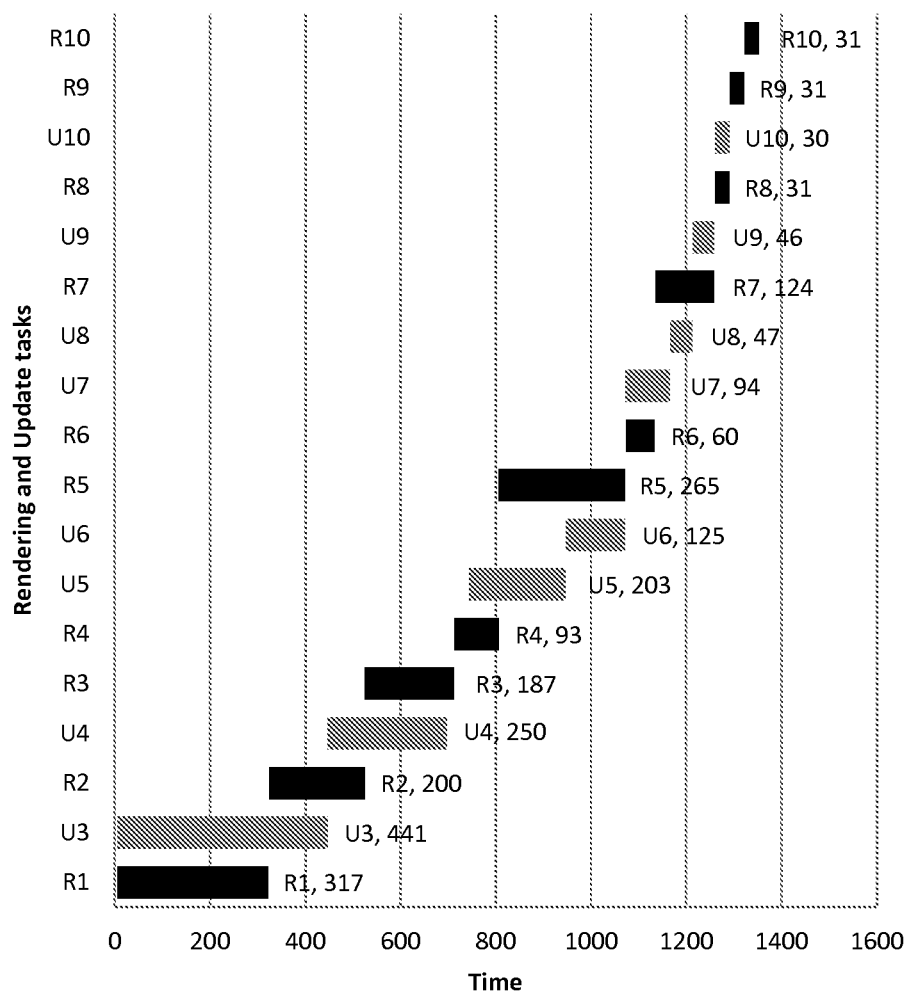
FIG. 10 is a bar chart showing the start time and the time taken by the rendering process in the second rendering pass to render each part comprising the illustrative engineering CAD assembly shown in FIG. 8.

FIG. 10 is a bar graph showing the start time and the time taken to render each part by the rendering process 404 (FIG. 4), and the start time and time taken to load each part, apart from those already in memory, by the concurrently executing update process 405 (FIG. 4) during the second rendering pass of the rendering process. The bars for the rendering process are shown in black and the bars for the update process are displayed in gray.

At the end of the first rendering pass the auto-optimize process deletes half the number of parts that were initially present in memory at the start of the first rendering pass. Since there were 4 parts in memory during the first rendering pass, there are now only 2 parts in memory (i.e. the parts with sizes 100 and 60 from FIG. 8). The total size of these 2 parts is 160 MB which leaves 90 MB for use by the update process.

As can be seen from FIG. 10 while the rendering process is rendering the first and second parts, R1 and R2, the update process is able to load the third part into memory U3. This enables the rendering process to render the third part R3 also from memory although it was not initially present in memory.

We can also see from FIG. 10 that the update process is unable to load the parts 5 and 7 fully into memory in time for the rendering process to render these parts. The rendering process therefore has to render the parts 5 and 7 directly from the storage device. This can be seen from the jump in the time required by the rendering process to render the parts 5 and 7 (R5 and R7 in FIG. 10). However, the rendering process is able to render the rest of the parts from memory. This decreases the overall time required to render the CAD assembly. The total time taken by the rendering process in this second rendering pass is around 1353 ms.

Figure 11:
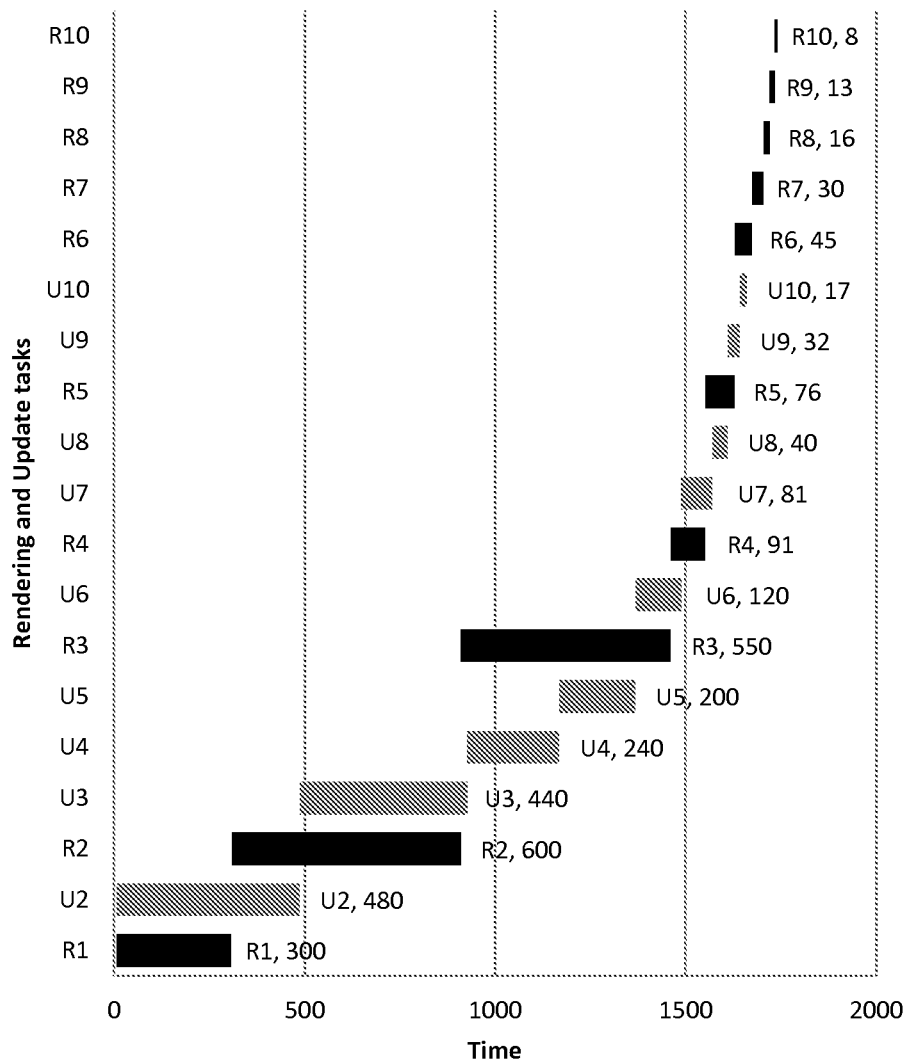
FIG. 11 is a bar chart showing the start time and the time taken by the rendering process in the third rendering pass to render each part comprising the illustrative engineering CAD assembly shown in FIG. 8.

FIG. 11 is a bar graph showing the start time and the time taken to render each part by the rendering process, and the start time and time taken to load each part, apart from those already in memory, by the concurrently executing update process during the third rendering pass of the rendering process. The bars for the rendering process are shown in black and the bars for the update process are displayed in gray.

At the end of the second rendering pass the rendering process again deletes half the parts from memory. Since there were 2 parts in memory during the second rendering pass, there is now only 1 part in memory (i.e. the part with size 100 from FIG. 8). This leaves 150 MB for use by the update process.

In the third rendering pass however the update process is unable to load the parts 2 and 3 in memory in time from the rendering pass to render them. In the case of part 2 the update process at U2 misses loading the part before the start of the rendering process at R2 by a large margin. And in the case of part 3 the update process at U3 just misses loading the part 3 in time for the rendering process at R3.

While the rendering process is able to load the rest of the parts directly from memory, its failure to render two large parts, 2 and 3, from memory makes this rendering pass much slower. The total time taken by the rendering process in this third rendering pass is around 1742 ms, which is much larger than the last pass. At the end of this pass therefore, the auto-optimize process 406 (FIG. 4) loads another part into memory, thus bringing the memory utilization to the state that it was in the previous rendering pass. The auto-optimize process also stops further auto-optimization by setting the auto-optimization variable AO to false as in the step 705 (FIG. 7).

What is claimed is:
1. A system for rendering data of a three-dimensional computer-aided design (3D CAD) assembly including a plurality of parts, each of the plurality of parts including triangulated geometry data suitable for rendering, the system comprising:
    a computing device;
    a data storage device in communication with the computing device and storing the data of the 3D CAD assembly;
    an input device in communication with the computing device and receiving input;
    a display device in communication with the computing device and displaying the triangulated geometry data of the 3D CAD assembly;
    a memory device in communication with the computing device, the memory device having available memory for temporarily storing the data of a subset of the plurality of parts of the 3D CAD assembly for rendering on the display device; and
    a program of instructions embodied in a tangible medium, the program of instructions causing the computing device to render the triangulated geometry data of the 3D CAD assembly on the display device in response to a request received by the input device, the program of instructions including:
        a parsing module of instructions causing the computing device to create an array storing, for each of the plurality of parts:
            a size of the triangulated geometry data of the part;
            a location of the triangulated geometry data of the part in the data storage device; and
            a location of the triangulated geometry data of the part in the memory device;
        a sorting module of instructions causing the computing device to sort the array in descending order of size of the triangulated geometry data of each of the plurality of parts;
        a loading module of instructions causing the computing device to sequentially load the triangulated geometry data of as many of the plurality of parts as will fit into the available memory, starting from a first part in the sorted array;
        a rendering module of instructions causing the computing device to sequentially render the triangulated geometry data of the parts in the available memory;
        an update module of instructions, executed concurrently with the rendering module of instructions, causing the computing device to remove from the available memory the triangulated geometry data of parts already rendered by the rendering module of instructions in a current rendering pass and previously loaded into the available memory by the update module of instructions, and loading into the available memory the triangulated geometry data of parts that are yet to be rendered in the current rendering pass;
        an auto-optimize module of instructions, executed after each rendering pass by the rendering module of instructions, causing the computing device to compare a time taken by the current rendering pass with a time taken in a previous rendering pass, and, if the time taken by the current rendering pass is less than or equal to that of the previous rendering pass, then removing from the available memory the triangulated geometry data of a predetermined fraction of the parts loaded into the available memory by the loading module of instructions.
2. The system of claim 1, wherein the rendering module of instructions also causes the computing device to render directly from the data storage device the triangulated geometry data of parts not in the available memory.

3. The system of claim 1, wherein the rendering module of instructions also causes the computing device to render placeholder wireframe boxes for parts not in the available memory.

4. The system of claim 1, wherein the rendering module of instructions periodically causes the computing device to execute the update module of instructions.

5. The system of claim 1, wherein the program of instructions causes the computing device to continuously execute the update module of instructions independent of the rendering module of instructions.

6. The system of claim 1, wherein, if the time taken by the current rendering pass is greater than that of the previous rendering pass, then the auto-optimize module of instructions causes the computing device to stop further removal of triangulated geometry data from the available memory.

7. The system of claim 1, wherein, if the time taken by the current rendering pass is greater than the time taken by the previous rendering pass, then the auto-optimize module of instructions causes the computing device to load back into the available memory the last predetermined fraction of the parts removed from memory by the auto-optimize module of instructions.

8. A method for rendering data of a three-dimensional computer-aided design (3D CAD) assembly including a plurality of parts, each of the plurality of parts including triangulated geometry data suitable for rendering, the method comprising:
 a parsing step of creating, by a computing device, an array storing, for each of the plurality of parts:
  a size of the triangulated geometry data of the part;
  a location of the triangulated geometry data of the part in a data storage device; and
  a location of the triangulated geometry data of the part in a memory device;
 a sorting step of sorting, by the computing device, the array in descending order of size of the triangulated geometry data of each of the plurality of parts;
 a loading step of sequentially loading, by the computing device, the triangulated geometry data of as many of the plurality of parts as will fit into available memory of the memory device, starting from a first part in the sorted array;
 a rendering process of sequentially rendering, by the computing device, the triangulated geometry data of the parts in the available memory;
 an update process, running concurrently with the rendering process, of removing, by the computing device, from the available memory the triangulated geometry data of parts already rendered by the rendering process in a current rendering pass and previously loaded in the available memory by the update process, and loading into memory the triangulated geometry data of parts that are yet to be rendered in the current rendering pass;
 an auto-optimize process, executed after each rendering pass by the rendering process, of comparing, by the computing device, a time taken by the current rendering pass with the time taken in a previous rendering pass, and if the time taken by the current rendering pass is less than or equal to that of the previous rendering pass, then removing from the available memory the triangulated geometry data of a predetermined fraction of the parts loaded into the available memory by the loading step.

9. The method of claim 8, wherein the rendering process also renders directly from the data storage device the triangulated geometry data of parts not in the available memory.

10. The method of claim 8, wherein the rendering process also renders placeholder wireframe boxes for parts not in the available memory.

11. The method of claim 8, wherein the rendering process periodically invokes the update process.

12. The method of claim 8, wherein the update process executes continuously independent of the rendering process.

13. The method of claim 8, wherein if the time taken by the current rendering pass is greater than that of the previous rendering pass, then the auto-optimize process stops further removal of triangulated geometry data from the available memory.

14. The method of claim 8, wherein if the time taken by the current rendering pass is greater than the time taken by the previous rendering pass, then the auto-optimize process loads back into the available memory the last predetermined fraction of the parts removed from memory by the auto-optimize process.

15. A computer-readable non-transitory storage medium storing instructions that when executed by a computing device cause the computing device to perform a method for rendering a three-dimensional computer-aided design (3D CAD) assembly including a plurality of parts, each of the plurality of parts including triangulated geometry data suitable for rendering, the method comprising:
 a parsing step of creating, by the computing device, an array storing, for each of the plurality of parts:
  a size of the triangulated geometry data of the part;
  a location of the triangulated geometry data of the part in a data storage device; and
  a location of the triangulated geometry data of the part in a memory device;
 a sorting step of sorting, by the computing device, the array in descending order of size of the triangulated geometry data of each of the plurality of parts;
 a loading step of sequentially loading, by the computing device, the triangulated geometry data of as many of the plurality of parts as will fit into available memory of the memory device, starting from a first part in the sorted array;
 a rendering process of sequentially rendering, by the computing device, the triangulated geometry data of the parts in the available memory;
 an update process, running concurrently with the rendering process, of removing, by the computing device, from the available memory the triangulated geometry data of parts already rendered by the rendering process in a current rendering pass and previously loaded in the available memory by the update process, and loading into memory the triangulated geometry data of parts that are yet to be rendered in the current rendering pass;
 an auto-optimize process, executed after each rendering pass by the rendering process, of comparing, by the computing device, a time taken by the current rendering pass with the time taken in a previous rendering pass, and if the time taken by the current rendering pass is less than or equal to that of the previous rendering pass, then removing from the available memory the triangulated geometry data of a predetermined fraction of the parts loaded into the available memory by the loading step.

* * * * *